(12) United States Patent
Kim

(10) Patent No.: US 7,843,037 B2
(45) Date of Patent: Nov. 30, 2010

(54) HIGH LEVEL INTEGRATION PHASE CHANGE MEMORY DEVICE HAVING AN INCREASED DIODE JUNCTION AREA AND METHOD FOR MANUFACTURING THE SAME

(75) Inventor: Kyung Do Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 172 days.

(21) Appl. No.: 12/346,187

(22) Filed: Dec. 30, 2008

(65) Prior Publication Data
US 2010/0117042 A1 May 13, 2010

(30) Foreign Application Priority Data
Nov. 10, 2008 (KR) ............. 10-2008-0111265

(51) Int. Cl.
*H01L 29/00* (2006.01)
(52) U.S. Cl. ............ 257/536; 257/537; 257/E27.047; 257/E29.326; 438/384; 438/385
(58) Field of Classification Search .......... 257/536, 257/537, E27.047, E29.326; 438/384, 385
See application file for complete search history.

(56) References Cited

U.S. PATENT DOCUMENTS

| | | | |
|---|---|---|---|
| 7,619,311 B2* | 11/2009 | Lung | 257/774 |
| 7,755,093 B2* | 7/2010 | Ohara | 257/74 |
| 2009/0200537 A1* | 8/2009 | Chang et al. | 257/4 |
| 2009/0207576 A1* | 8/2009 | Gardner et al. | 361/782 |
| 2009/0251944 A1* | 10/2009 | Happ et al. | 365/148 |
| 2010/0072447 A1* | 3/2010 | Lung | 257/3 |
| 2010/0133500 A1* | 6/2010 | Lung | 257/3 |
| 2010/0200829 A1* | 8/2010 | Dennison et al. | 257/3 |

* cited by examiner

*Primary Examiner*—Ngan Ngo
(74) *Attorney, Agent, or Firm*—Ladas & Parry LLP

(57) ABSTRACT

A phase change memory device includes a semiconductor substrate active region, a plurality of first conductivity type silicon pillars, and a plurality of second conductivity type silicon patterns. The plurality of first conductivity type silicon pillars is formed on the semiconductor active region such that each first conductivity type silicon pillar is provided for two adjoining cells. The plurality of second conductivity type silicon patterns is formed on the plurality of first conductivity type silicon pillars such that two second conductivity type silicon patterns are formed on opposite sidewalls of each first conductivity type silicon pillars. Two adjoining cells together share only one first conductivity type silicon pillar and each adjoining cell is connected to only one second conductivity type silicon pattern which constitutes a PN diode which serves as a single switching element for each corresponding cell.

32 Claims, 5 Drawing Sheets

HIGH LEVEL INTEGRATION PHASE CHANGE MEMORY DEVICE HAVING AN INCREASED DIODE JUNCTION AREA AND METHOD FOR MANUFACTURING THE SAME

CROSS-REFERENCE TO RELATED APPLICATIONS

The present application claims priority to Korean patent application number 10-2008-0111265 filed on Nov. 10, 2008, which is incorporated herein by reference in its entirety.

BACKGROUND OF THE INVENTION

The present invention relates to a phase change memory device and a method for manufacturing the same, and more particularly, to a phase change memory device which can increase a junction area between an N-type area and a P-type area when forming PN diodes as cell switching elements and a method for manufacturing the same.

In general, memory devices are largely divided into two groups. The volatile RAMs (random access memory) end up losing their inputted information when the power is interrupted. In contrast, non-volatile ROMs (read-only memory) can continuously maintain their stored state of inputted information even when power is interrupted. As among volatile RAMs, the DRAM (dynamic RAM) and the SRAM (static RAM) are well known examples. As among the non-volatile ROMs, flash memory devices such as an EEPROM (electrically erasable and programmable ROM) are well known examples.

Even though DRAMs belong to group of excellent memory devices, DRAMs require a relatively high charge storing capacity. To this end, since the surface area of an electrode must be increased, it is difficult if not impossible to accomplish a high level of integration of DRAMs. Further, with regards to flash memory devices, because these devices comprise two stacked gates, a high operation voltage is required and often times a separate booster circuit is needed to generate the necessary operation voltage for writing and deletion operations. Likewise, flash memory devices also suffer from being difficult if not impossible to accomplish a high level of integration.

With this in mind, it is not surprising that research and development efforts have continued to be pursued in the hopes of eventually uncovering an alternate novel memory device which has the features having a simple configuration and being capable of accomplishing a high level of integration while retaining many of the desirable characteristics of a non-volatile memory device.

One example of a potential alternate memory device that promises to exhibit a high level of integration is the phase change memory device. Phase change memory devices work on the basis of the fact that a phase change occurs in a phase change layer interposed between a bottom electrode and a top electrode. One particular phase change of interest comprises a reversible transition between an ordered crystalline phase state and that of an amorphous phase state. This reversible phase transition can be induced by flowing electrical current between the bottom electrode and the top electrode. Accordingly, information, i.e., data storage, can be correlated with the different phase states of the memory cell. One way of recognizing different phase states is to use the difference in the resultant resistance across the two electrodes in which the resistance is dependent upon whether or not the phase change material is in an ordered crystalline phase state and in an amorphous phase state.

One of the most important factors that must be considered in developing phase change memory devices is to reduce the programming current. With this in mind, recently developed phase change memory devices that employ vertical PN diodes as the phase change working components are of interest as cell switching elements instead of NMOS transistor designs. In particular by employing the vertical phase change PN diodes, it is possible to realize a highly integrated phase change memory device because of their simplicity in design and because of the simplicity in electrically driving these devices.

In order to form the vertical PN diodes, in conventional arts, after growing epi-silicon doped with N-type impurities, the P-type impurities are then ion-implanted into the upper end of the grown N-type epi-silicon.

However, these types of conventional vertical PN diodes suffer a problem when highly integrating these devices in that their junction areas between an N-type area and a P-type area become too small which means that their operating currents decrease. Even though the junction area between the N-type area and the P-type area can be increased by simply increasing the size of the N-type epi-silicon, the degree of integration is correspondingly adversely influenced in this case.

Therefore, in order to improve the characteristics of the phase change memory device, it is necessary to increase the junction area between the N-type area and the P-type area of the vertical PN diodes while not adversely influencing the degree of integration.

SUMMARY OF THE INVENTION

Embodiments of the present invention are directed to a phase change memory device that can increase a junction area between an N-type area and a P-type area in PN diodes as cell switching elements, and a method for manufacturing the same.

Embodiments of the present invention are also directed to a phase change memory device that can increase an operating current, and a method for manufacturing the same.

Further, embodiments of the present invention are directed to a phase change memory device that can elevate the degree of integration, and a method for manufacturing the same.

In one aspect of the present invention, a phase change memory device comprises a semiconductor substrate having an active region; a plurality of first conductivity type silicon pillars formed such that each first conductivity type silicon pillar is provided for two adjoining phase change cells and is located at boundaries of the two adjoining phase change cells; and a plurality of second conductivity type silicon patterns formed on the plurality of first conductivity type silicon pillars, such that two second conductivity type silicon patterns are formed on opposite sidewalls of each of the first conductivity type silicon pillars and each adjoining phase cell is connected to only one second conductivity type silicon pattern which constitutes a PN diode in cooperation with the corresponding first conductivity type silicon pillar in which each PN diode serves as a single switching element for each corresponding phase cell.

The active region is a bar type.

The phase change memory device further comprises a first conductivity type high concentration area formed in a surface of the active region.

The first conductivity type is an N-type and the second conductivity type is a P-type.

The first conductivity type high concentration area has an impurity concentration of about $1\times10^{20}\sim1\times10^{22}$ ions/cm$^3$.

The first conductivity type silicon pillars have an impurity concentration of about $1\times10^{17}\sim1\times10^{20}$ ions/cm$^3$.

The first conductivity type silicon pillars have a height of about 500~3,000 Å.

The second conductivity type silicon patterns have an impurity concentration of about $1\times10^{20}\sim1\times10^{22}$ ions/cm$^3$.

The second conductivity type silicon patterns have a step shape pattern which extends from an upper surface of the first conductivity type silicon pillar to an adjacent portion of the active region.

The second conductivity type silicon patterns have a thickness of about 50~1,000 Å.

The phase change memory device further comprises an insulation layer interposed between the second conductivity type silicon patterns and the first conductivity type high concentration area.

The insulation layer comprises at least one of an oxide layer and a nitride layer.

The phase change memory device further comprises bottom electrodes formed to contact the second conductivity type silicon patterns; and stack patterns of a phase change layer and top electrodes, formed on the bottom electrodes.

The bottom electrodes are formed of any one of W, Cu, Al, and WSi.

The phase change layer is formed of a compound which contains at least one of Ge, Sb and Te.

The phase change layer is ion-implanted with at least one of oxygen, nitrogen and silicon.

The top electrodes are formed of any one of TiAlN, TiW, TiN and WN.

The stack patterns of the phase change layer and the top electrodes are a line type.

In another aspect of the present invention, a method for manufacturing a phase change memory device comprises the steps of forming a plurality of first conductivity type silicon pillars in an active region of a semiconductor substrate such that each first conductivity type silicon pillar is located for two adjoining cells; and forming a plurality of second conductivity type silicon patterns on the first conductivity type silicon pillars such that two second conductivity type silicon patterns are formed on opposite sidewalls of each corresponding first conductivity type silicon pillar wherein the two adjoining phase cells together share only one first conductivity type silicon pillar and each adjoining phase cell is connected to only one second conductivity type silicon pattern which constitutes a PN diode in cooperation with the corresponding first conductivity type silicon pillar in which each PN diode serves as a single switching element for each corresponding phase change cell.

The active region is formed into a bar type.

Before the step of forming the first conductivity type silicon pillars, the method further comprises the step of forming a first conductivity type high concentration area in a surface of the active region.

The first conductivity type is an N-type and the second conductivity type is a P-type.

The first conductivity type high concentration area is formed to have an impurity concentration of about $1\times10^{20}\sim1\times10^{22}$ ions/cm$^3$.

The first conductivity type silicon pillars are formed to have an impurity concentration of about $1\times10^{17}\sim1\times10^{20}$ ions/cm$^3$.

The first conductivity type silicon pillars are formed to have a height of about 500~3,000 Å.

The step of forming the first conductivity type silicon pillars comprises the steps of forming a sacrificial layer on the semiconductor substrate; etching the sacrificial layer and thereby defining holes such that each hole is located for two adjoining cells; forming a first conductivity type silicon layer on the sacrificial layer to fill the holes; removing portions of the first conductivity type silicon layer which are formed on the sacrificial layer; and removing remaining portions of the sacrificial layer.

The sacrificial layer comprises an oxide layer.

Before the step of forming the sacrificial layer, the method further comprises the step of forming an insulation layer.

The insulation layer comprises any one of an oxide layer and a nitride layer.

The step of forming the first conductivity type silicon layer is implemented through a selective epitaxial growth process.

The second conductivity type silicon patterns are formed to have an impurity concentration of about $1\times10^{20}\sim1\times10^{22}$ ions/cm$^3$.

The second conductivity type silicon patterns are formed to have a step shape pattern which extends from an upper surface of the first conductivity type silicon pillar to an adjacent portion of the first conductivity type high concentration area.

The second conductivity type silicon patterns are formed to have a thickness of about 50~1,000 Å.

The step of forming the second conductivity type silicon patterns comprises the steps of depositing a second conductivity type silicon layer into which second conductivity type impurities are doped at a high concentration, onto the semiconductor substrate formed with the first conductivity type silicon pillars; and etching the second conductivity type silicon layer into which the second conductivity type impurities are doped at the high concentration, to have a step shape pattern which extends from an upper surface of the first conductivity type silicon pillar via one sidewall of the first conductivity type silicon pillar to an adjacent portion of the first conductivity type high concentration area.

The step of forming the second conductivity type silicon patterns comprises the steps of depositing an undoped silicon layer on the semiconductor substrate formed with the first conductivity type silicon pillars; ion-implanting second conductivity type impurities into the silicon layer at a high concentration; and etching the silicon layer ion-implanted with the second conductivity type impurities at the high concentration, to have a step shape pattern which extends from an upper surface of the first conductivity type silicon pillar via one sidewall of the first conductivity type silicon pillar to an adjacent portion of the first conductivity type high concentration area.

The step of forming the second conductivity type silicon patterns comprises the steps of depositing a silicon layer into which second conductivity type impurities are doped at a low concentration, onto the semiconductor substrate formed with the first conductivity type silicon pillars; ion-implanting second conductivity type impurities into the silicon layer which is doped with the second conductivity type impurities at the low concentration, at a high concentration; and etching the silicon layer ion-implanted with the second conductivity type impurities at the high concentration, to have a step shape pattern which extends from an upper surface of the first conductivity type silicon pillar via one sidewall of the first conductivity type silicon pillar to an adjacent portion of the first conductivity type high concentration area.

After the step of forming the second conductivity type silicon patterns, the method further comprises the steps of forming bottom electrodes to contact the second conductivity type silicon patterns; and forming stack patterns of a phase change layer and top electrodes, on the bottom electrodes.

The bottom electrodes are formed of any one of W, Cu, Al, and WSi.

The phase change layer is formed of a compound which contains at least one of Ge, Sb and Te.

The phase change layer is formed by being ion-implanted with at least one of oxygen, nitrogen and silicon.

The top electrodes are formed of any one of TiAlN, TiW, TiN and WN.

The stack patterns of the phase change layer and the top electrodes are a line type.

DESCRIPTION OF SPECIFIC EMBODIMENTS

Hereafter, the specific embodiments of the present invention will be described in detail with reference to the accompanying drawings.

Figure 1:
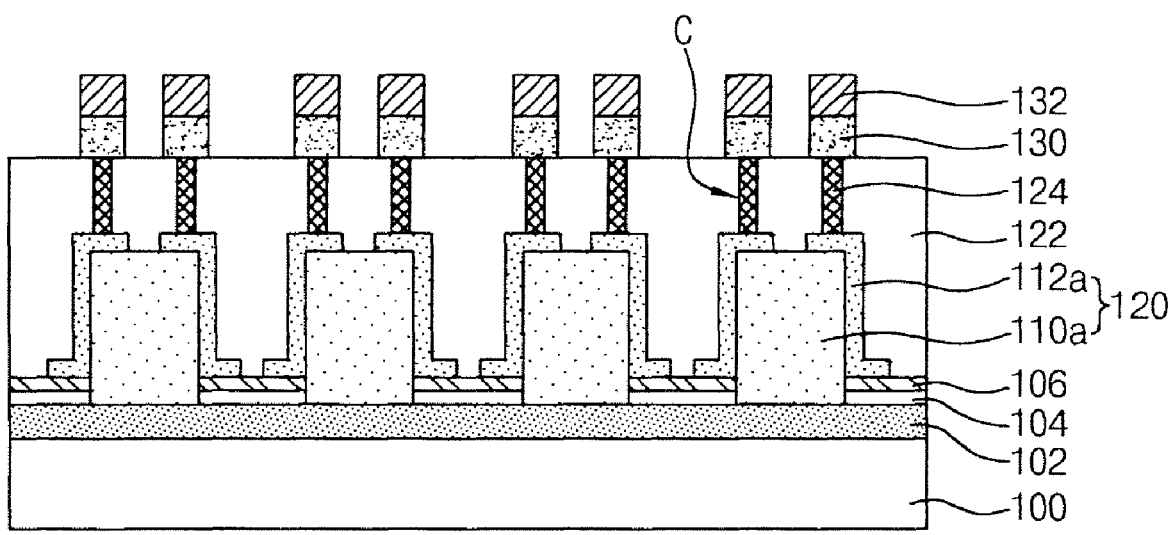
FIG. 1 is a sectional view showing a phase change memory device in accordance with an embodiment of the present invention.

FIG. 1 is a sectional view illustrating a phase change memory device in accordance with an embodiment of the present invention.

Referring to FIG. 1, a first conductivity type high concentration area, that is, an N+ base area 102, into which N-type impurities are ion-implanted at a high concentration, is formed in the surface of a semiconductor substrate 100. The semiconductor substrate 100 has a bar type active region. It is preferred that the N+ base area 102 be understood as being formed in the surface of the active region. The N+ base area 102 has an impurity concentration of, for example, between about $1\times10^{20}$~$1\times10^{22}$ ions/cm$^3$.

First conductivity type silicon pillars, that is, N-type silicon pillars 110a, which are doped with N-type impurities, are formed in the active region of the semiconductor substrate 100 which is formed with the N+ base area 102, such that each N-type silicon pillar 110a is provided for two adjoining cells. The N-type silicon pillars 110a have a height of about 500~3,000 Å and an impurity concentration of about $1\times10^{17}$~$1\times10^{20}$ ions/cm$^3$.

Insulation layers 104 and 106 are then formed on the N+ base area 102 between the N-type silicon pillars 110a. The insulation layers may be composed of a single layer of an oxide layer 104 or a nitride layer 106. However, it is preferable that the insulation layers be formed to as a stack layer of an oxide layer 104 and a nitride layer 106. The nitride layer 106 also serves as an etch stop layer, and the oxide layer 104 also serves as a stress buffer layer.

Second conductivity type silicon patterns, that is, P-type silicon patterns 112a, which are doped with P-type impurities at a relatively high concentration, are formed on both respective sidewalls of the N-type silicon pillars 110a. Thereby forming the PN diodes 120 that serve as cell switching elements in cooperation with the N-type silicon pillars 110a. The respective P-type silicon patterns 112a have a step pattern shape which extends from the upper surface of the N-type silicon pillar 110a to the adjacent nitride layer 106 formed in the active region. The P-type silicon patterns 112a may have a thickness of about 50~1,000 Å and an impurity concentration of between about $1\times10^{20}$~$1\times10^{22}$ ions/cm$^3$.

An interlayer dielectric 122 is formed on the entire surface of the semiconductor substrate 100 which is formed along with the PN diodes 120 which serve as cell switching elements. The bottom electrodes 124 serve as heaters and are formed in the interlayer dielectric 122 in the shape of a plug to contact the P-type silicon patterns 112a of the PN diodes 120. The stack patterns of a phase change layer 130 and top electrodes 132 are sequentially formed on the bottom electrodes 124 and are formed adjacent to portions of the interlayer dielectric 122.

For example, the bottom electrodes 124 may be formed of any one of W, Cu, Al and WSi. The phase change layer 130 may be formed of a compound which contains at least one of Ge, Sb and Te and into which at least one of oxygen, nitrogen and silicon is ion-implanted. The top electrodes 132 are formed of any one of TiAlN, TiW, TiN and WN. Preferably, the stack patterns of the phase change layer 130 and the top electrodes 132 are formed in the type shaped along a vertical line that extends in a direction perpendicular to the extending direction of the horizontal bar type active region.

Although not shown in the drawings, bit lines are formed over the top electrodes 132 to contact the top electrodes 132. Word lines (also not shown) are formed over the bit lines to contact the N+ base areas 102.

In the phase change memory device according to one embodiment, the PN diodes 120 are formed in such a manner so as to provide two adjoining cells that share one N-type silicon pillar 110a, and to provide junction surfaces between an N-type area and a P-type area formed on the sidewalls of the N-type silicon pillar 110a. The reference character C is shown which designates a contact hole for forming the bottom electrode 124.

Accordingly, in the phase change memory device according to the embodiment, the junction area between an N-type area and a P-type area can be considerably increased when compared to those found in the conventional art. Therefore, operating current can be increased of the present invention relative to those used in the conventional art. Thereby the operation characteristics of the phase change memory device of the present invention can be considerably improved as opposed to those found in more conventional arts. Also, since the phase change memory device according to the present invention has a unique structure in which two adjoining cells commonly share one N-type silicon pillar to form two cell switching elements constituted by PN diodes, the degree of integration can be also be considerably enhanced when compared to those found in the more conventional arts.

FIGS. 2A through 2G are sectional views illustrating some of the key processes of manufacturing the phase change memory device in accordance with another embodiment of the present invention. The method will be described below.

Figure 2A:
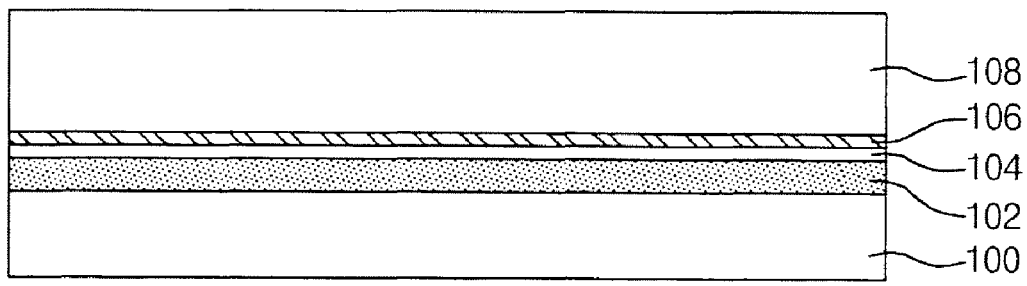
FIGS. 2A through 2G are sectional views shown for illustrating the processes of a method for manufacturing a phase change memory device in accordance with another embodiment of the present invention.

Referring to FIG. 2A, by ion-implanting N+ conductivity type impurities into having a horizontal bar type active region of a semiconductor substrate 100, a first N+ conductivity type high concentration area, that is, an N+ base area 102 is formed in the surface of the active region. The N+ base area 102 is formed to electrically connect together a word line and cell switching elements. The N+ base area 102 is formed to have an N+ impurity concentration of about $1\times10^{20}$~$1\times10^{22}$ ions/cm$^3$.

An oxide layer 104 and a nitride layer 106 are sequentially formed on the semiconductor substrate 100 which is formed with the N+ base area 102, to constitute an insulation layer. The nitride layer 106 is also formed to serve as an etch stop layer in a subsequent etching process, and the oxide layer 104 is also formed to serve as a stress buffer layer. A sacrificial layer 108 is formed on the nitride layer 106. The sacrificial layer 108 is formed to delimit areas in where cell switching elements are to be formed. Preferably, the sacrificial layer 108 is formed as an oxide layer. Here, the oxide layer 104, the nitride layer 106, and the sacrificial layer 108 are formed such that their total thickness corresponds to about 500~3,000 Å.

Figure 2B:
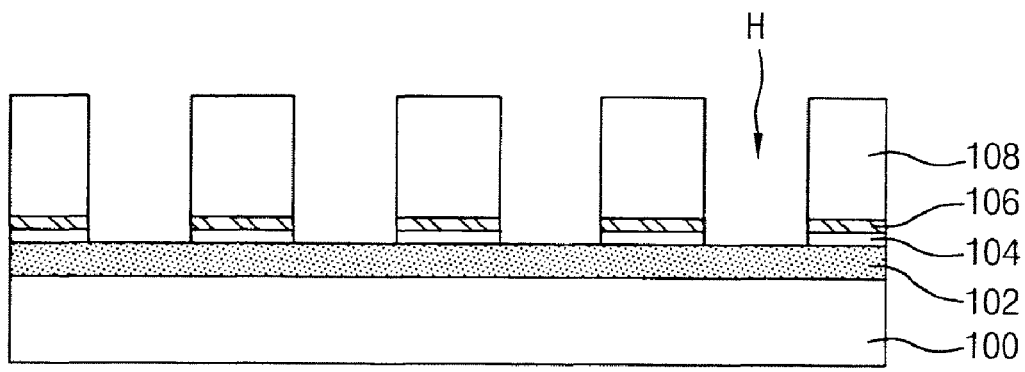

Referring to FIG. 2B, by selectively etching the sacrificial layer 108, the nitride layer 106 and the oxide layer 104, a plurality of holes H are defined which expose portions of the N+ base area 102. Preferably, the holes H are defined in such a manner so as that each hole H is located at the boundaries of two adjoining cells.

Figure 2C:
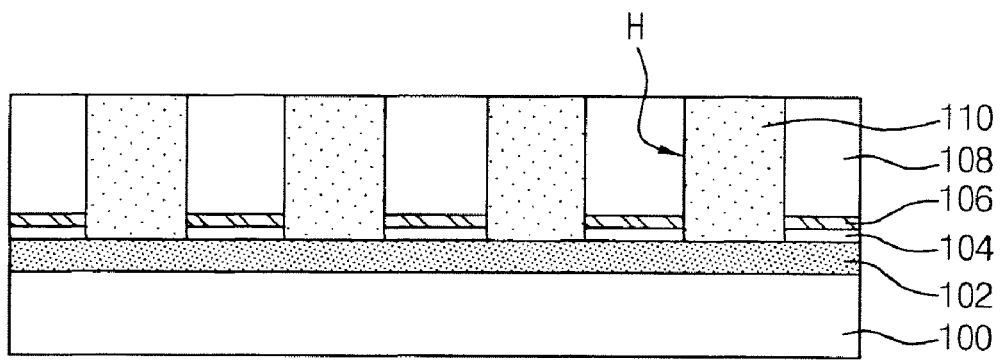

Referring to FIG. 2C, after growing a first conductivity type silicon layer, that is, an N-type silicon layer 110 which is doped with N-type impurities, on the sacrificial layer 108 to fill the holes H, the portions of the N-type silicon layer 110 which are formed on the sacrificial layer 108 are subsequently removed by using well known techniques such as a CMP (chemical mechanical polishing) process or an etch-back process. The N-type silicon layer 110 is grown through a selective epitaxial growth process to have an impurity concentration of, for example, $1\times10^{17}$~$1\times10^{20}$ ions/cm$^3$.

Figure 2D:
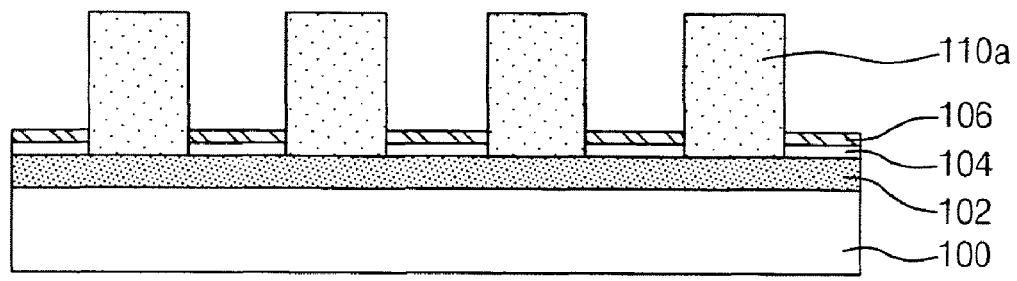

Referring to FIG. 2D, by removing the remaining sacrificial layer 108 through wet etching or dry etching, first conductivity type silicon pillars, that is, N-type silicon pillars 110a is formed such that each N-type silicon pillar 110a is provided for two adjoining cells and is located at the boundaries of the two adjoining cells. Here, the N-type silicon pillars 110a are formed to have a height of about 500~3,000 Å and an impurity concentration of about $1\times10^{17}$~$1\times10^{20}$ ions/cm$^3$.

Figure 2E:
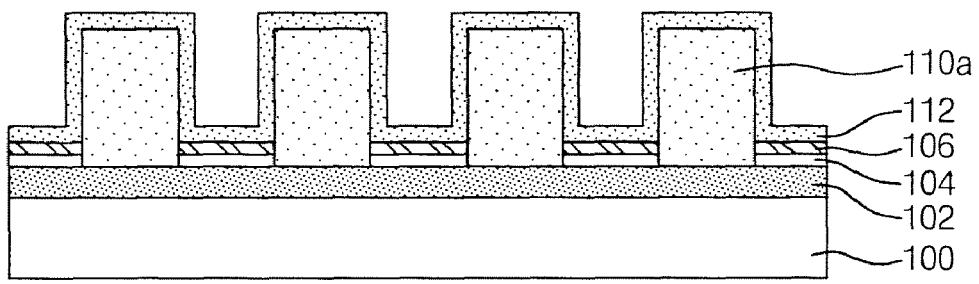

Referring to FIG. 2E, a second conductivity type silicon layer, that is, a P-type silicon layer 112 is then formed to a uniform thickness on the plurality of N-type silicon pillars 110a and on the nitride layer 106 between the N-type silicon pillars 110a. The P-type silicon layer 112 is preferably formed to have a thickness of about 50~1,000 Å and having a P-type impurity concentration of about $1\times10^{20}$~$1\times10^{22}$ ions/cm$^3$.

The P-type silicon layer 112 can be formed using any number of different methods of doping P-type impurities at a high concentration of about $1\times10^{20}$~$1\times10^{22}$ ions/cm$^3$ when depositing a silicon layer. One method might be to deposit the silicon layer in an undoped state and then ion-implanting P-type impurities until the P-type impurity concentration reaches to about $1\times10^{20}$~$1\times10^{22}$ ions/cm$^3$. Another method might be to deposit a P-type silicon layer in the state in which P-type impurities are already doped at a low impurity concentration lower than a desired impurity concentration and then ion-implanting additional P-type impurities into the P-type silicon layer until the desired P-type impurity concentration of about $1\times10^{20}$~$1\times10^{22}$ ions/cm$^3$ is reached.

Figure 2F:
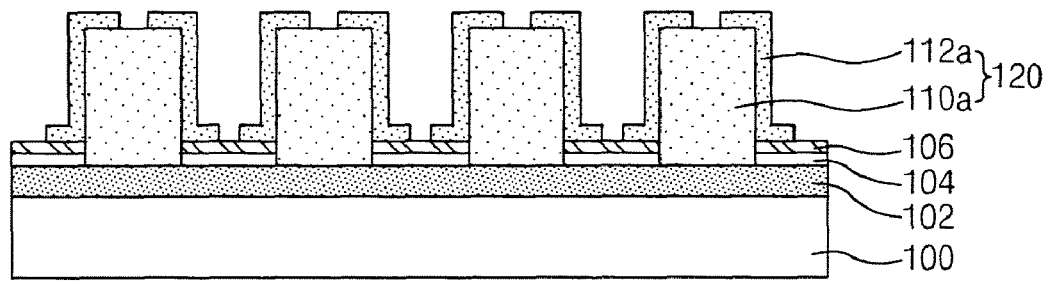

Referring to FIG. 2F, second conductivity type silicon patterns, that is, P-type silicon patterns 112a are next formed on both respective sidewalls of the N-type silicon pillars 110a by etching the P-type silicon layer 112. Through this step, the PN diodes 120 that serve as the cell switching elements are formed. The P-type silicon patterns 112a are formed in a step pattern shape that extends from the upper surface of the N-type silicon pillar 110a down to the adjacent nitride layer 106 on the N+ base layer 102. Here, the P-type silicon patterns 112a are formed to have a thickness of about 50~1,000 Å and to have a P-type impurity concentration of about $1\times10^{20}$~$1\times10^{22}$ ions/cm$^3$.

Here, the PN diodes 120 are formed such that two adjoining cells share a common N-type silicon pillar 110a which is formed at the boundaries of the two adjoining cells.

Figure 2G:
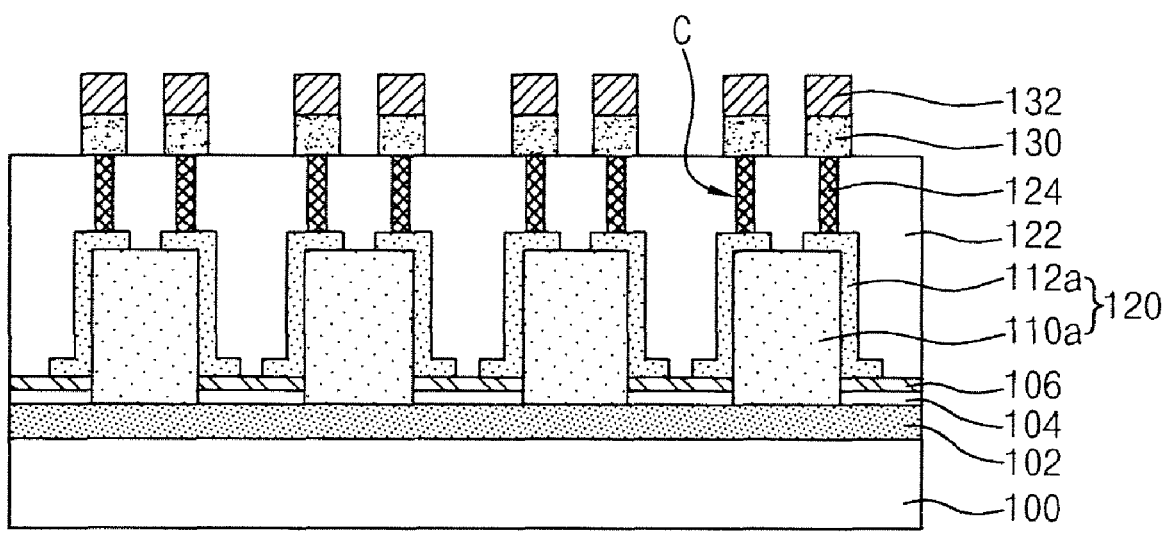

Referring to FIG. 2G, next an interlayer dielectric 122 is formed on the resultant semiconductor substrate 100 having the PN diodes 120 composed of the N-type silicon pillars 110a and the P-type silicon patterns 112a. After defining contact holes C to expose the P-type silicon patterns 112a of the PN diodes 120 by etching the interlayer dielectric 122, a conductive layer made of any one of W, Cu, Al and WSi is used to fill in the contact holes C. Bottom electrodes 124 are then formed to contact the P-type silicon patterns 112a. Next a phase change material layer and a conductive layer for top electrodes on the bottom electrodes 124 and the interlayer dielectric 122 are sequentially forming. Afterwards, by selectively etching the phase change material layer and the conductive layer for top electrodes, the stack patterns of a phase change layer 130 and top electrodes 132 are then formed on the interlayer dielectric 122 and on the bottom electrodes 124.

Here, the phase change layer 130 is formed of any of the phase change compounds that contain at least one of Ge, Sb and Te and into which any one of oxygen, nitrogen and silicon is then ion-implanted. The top electrodes 132 are formed of any of the conducting elements such as TiAlN, TiW, TiN, and WN. The stack patterns of the phase change layer 130 and the top electrodes 132 are preferably formed in the type of a vertical line that extends in a direction perpendicular to the extending direction of the horizontal bar type active region.

Thereafter, while not shown in the drawings, by sequentially conducting a series of subsequent processes including processes for forming bit lines and word lines, the manufacture of a phase change memory device according to the present embodiment is completed.

As is apparent from the above description, in the present invention, PN diodes are formed by forming P-type silicon patterns on the sidewalls of an N-type silicon pillar. Accordingly, in the present invention, since the junction between an N-type area and a P-type area is effected along the sidewalls of the N-type silicon pillar, then the junction area between the N-type area and the P-type area can be increased, whereby operating current can be increased as compared to the conventional art in which the N-type area and the P-type area are vertically stacked.

Also, in the present invention, because the PN diodes are formed in such a manner as to provide two adjoining cells to share a common N-type silicon pillar, then the degree of integration can be further increased when compared to the conventional art.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A phase change memory device comprising:
a semiconductor substrate having an active region;
a plurality of first conductivity type silicon pillars formed on the substrate, such that each first conductivity type silicon pillar is provided for two adjoining phase cells and is located at boundaries of the respective two adjoining phase cells; and
a plurality of second conductivity type silicon patterns formed on the plurality of first conductivity type silicon pillars, such that two second conductivity type silicon patterns are formed on opposite sidewalls of each respective first conductivity type silicon pillars wherein the two adjoining phase cells together share only one first conductivity type silicon pillar and each adjoining phase cell is connected to only one second conductivity type silicon pattern which constitutes a PN diode in cooperation with the corresponding first conductivity type silicon pillar in which each PN diode serves as a single switching element for each corresponding phase cell.

2. The phase change memory device according to claim 1, wherein the active region is a bar type.

3. The phase change memory device according to claim 1, further comprising:
   a first conductivity type high concentration area is formed in a surface of the active region.

4. The phase change memory device according to claim 1, wherein the first conductivity type is an N-type and the second conductivity type is a P-type.

5. The phase change memory device according to claim 3, wherein the first conductivity type has an impurity concentration of about $1 \times 10^{20} \sim 1 \times 10^{22}$ ions/cm$^3$.

6. The phase change memory device according to claim 1, wherein the first conductivity type silicon pillars have an impurity concentration of about $1 \times 10^{17} \sim 1 \times 10^{20}$ ions/cm$^3$.

7. The phase change memory device according to claim 1, wherein the first conductivity type silicon pillars have a height of about 500~3,000 Å.

8. The phase change memory device according to claim 1, wherein the second conductivity type silicon patterns have an impurity concentration of about $1 \times 10^{20} \sim 1 \times 10^{22}$ ions/cm$^3$.

9. The phase change memory device according to claim 1, wherein the second conductivity type silicon patterns have a step shape pattern that extends from an upper surface of the first conductivity type silicon pillar to an adjacent portion of the active region.

10. The phase change memory device according to claim 1, wherein the second conductivity type silicon patterns have a thickness of about 50~1,000 Å.

11. The phase change memory device according to claim 3, further comprising:
    an insulation layer interposed between the second conductivity type silicon patterns and the first conductivity type high concentration area.

12. The phase change memory device according to claim 11, wherein the insulation layer comprises at least one of an oxide layer and a nitride layer.

13. The phase change memory device according to claim 1, further comprising:
    bottom electrodes contacting the second conductivity type silicon patterns; and
    stack patterns of a phase change layer and top electrodes, formed on the bottom electrodes.

14. A method for manufacturing a phase change memory device, comprising the steps of:
    forming a plurality of first conductivity type silicon pillars in an active region of a semiconductor substrate such that each first conductivity type silicon pillar is located for two adjoining phase cells; and
    forming a plurality of second conductivity type silicon patterns on the first conductivity type silicon pillars such that two second conductivity type silicon patterns are formed on opposite sidewalls of each corresponding first conductivity type silicon pillar wherein the two adjoining phase cells together share only one first conductivity type silicon pillar and each adjoining phase cell is connected to only one second conductivity type silicon pattern which constitutes a PN diode in cooperation with the corresponding first conductivity type silicon pillar in which each PN diode serves as a single switching element for each corresponding phase change cell.

15. The method according to claim 14, wherein the active region is formed into a bar type.

16. The method according to claim 14, wherein, before the step of forming the first conductivity type silicon pillars, the method further comprises the step of:
    forming a first conductivity type high concentration area in a surface of the active region.

17. The method according to claim 14, wherein the first conductivity type is an N-type and the second conductivity type is a P-type.

18. The method according to claim 16, wherein the first conductivity type high concentration area has an impurity concentration of about $1 \times 10^{20} \sim 1 \times 10^{22}$ ions/cm$^3$.

19. The method according to claim 14, wherein the first conductivity type silicon pillars has an impurity concentration of about $1 \times 10^{17} \sim 1 \times 10^{20}$ ions/cm$^3$.

20. The method according to claim 14, wherein the first conductivity type silicon pillars are formed to have a height of about 500~3,000 Å.

21. The method according to claim 14, wherein the step of forming the first conductivity type silicon pillars comprises the steps of:
    forming a sacrificial layer on the semiconductor substrate;
    etching selectively the sacrificial layer to define holes such that each hole is located for two adjoining cells;
    forming a first conductivity type silicon layer on the sacrificial layer to fill the holes;
    removing portions of the first conductivity type silicon layer which are formed on the sacrificial layer; and
    removing any remaining portions of the sacrificial layer.

22. The method according to claim 21, wherein the sacrificial layer comprises an oxide layer.

23. The method according to claim 21, wherein, before the step of forming the sacrificial layer, the method further comprises the step of forming an insulation layer on the active region of the semiconductor substrate.

24. The method according to claim 23, wherein the insulation layer comprises any one of an oxide layer and a nitride layer.

25. The method according to claim 21, wherein the step of forming the first conductivity type silicon layer is implemented through a selective epitaxial growth process.

26. The method according to claim 14, wherein the second conductivity type silicon patterns has an impurity concentration of about $1 \times 10^{20} \sim 1 \times 10^{22}$ ions/cm$^3$.

27. The method according to claim 16, wherein the second conductivity type silicon patterns are formed to have a step shape pattern that extends from an upper surface of the first conductivity type silicon pillar to an adjacent portion of the first conductivity type high concentration area.

28. The method according to claim 14, wherein the second conductivity type silicon patterns are formed to have a thickness of about 50~1,000 Å.

29. The method according to claim 16, wherein the step of forming the second conductivity type silicon patterns comprises the steps of:
    depositing a second conductivity type silicon layer into which second conductivity type impurities are doped onto the semiconductor substrate formed with the first conductivity type silicon pillars; and
    etching the second conductivity type silicon layer into which the second conductivity type impurities are doped to have a step shape pattern that extends from an upper surface of the first conductivity type silicon pillar via one sidewall of the first conductivity type silicon pillar to an adjacent portion of the first conductivity type high concentration area.

30. The method according to claim 16, wherein the step of forming the second conductivity type silicon patterns comprises the steps of:
   depositing an undoped silicon layer on the semiconductor substrate formed with the first conductivity type silicon pillars;
   ion-implanting second conductivity type impurities into the undoped silicon layer; and
   etching the silicon layer ion-implanted with the second conductivity type impurities to form a step shape pattern that extends from an upper surface of the first conductivity type silicon pillar via one sidewall of the first conductivity type silicon pillar to an adjacent portion of the first conductivity type high concentration area.

31. The method according to claim 16, wherein the step of forming the second conductivity type silicon patterns comprises the steps of:
   depositing a silicon layer into which second conductivity type impurities are doped onto the semiconductor substrate formed with the first conductivity type silicon pillars;
   ion-implanting second conductivity type impurities into the silicon layer which is already doped with the second conductivity type impurities; and
   etching the silicon layer ion-implanted with the second conductivity type impurities to form a step shape pattern that extends from an upper surface of the first conductivity type silicon pillar via one sidewall of the first conductivity type silicon pillar to an adjacent portion of the first conductivity type high concentration area.

32. The method according to claim 14, wherein, after the step of forming the second conductivity type silicon patterns, the method further comprises the steps of:
   forming bottom electrodes to contact the second conductivity type silicon patterns; and
   forming stack patterns, of a phase change layer and top electrodes, on the bottom electrodes.

* * * * *